United States Patent
Matsunaga et al.

(10) Patent No.: US 6,281,691 B1
(45) Date of Patent: Aug. 28, 2001

(54) TIP PORTION STRUCTURE OF HIGH-FREQUENCY PROBE AND METHOD FOR FABRICATION PROBE TIP PORTION COMPOSED BY COAXIAL CABLE

(75) Inventors: Kouji Matsunaga; Hirobumi Inoue; Masao Tanehashi; Toru Taura; Masahiko Nikaidou, all of Tokyo; Yuuichi Yamagishi, Osaka; Satoshi Hayakawa, Kanagawa, all of (JP)

(73) Assignees: NEC Corporation; Amritsu Corporation, both of Tokyo (JP)

( * ) Notice: Subject to any disclaimer, the term of this patent is extended or adjusted under 35 U.S.C. 154(b) by 0 days.

(21) Appl. No.: 09/328,362

(22) Filed: Jun. 9, 1999

(30) Foreign Application Priority Data

| Jun. 9, 1998 | (JP) | 10-161021 |
| Jun. 16, 1998 | (JP) | 10-167991 |
| Jun. 16, 1998 | (JP) | 10-168248 |
| Feb. 25, 1999 | (JP) | 11-048325 |

(51) Int. Cl.$^7$ .................................................. G01R 31/02
(52) U.S. Cl. ........................ 324/754; 324/761; 324/762
(58) Field of Search .................................. 324/754, 761, 324/762, 757, 758, 765

(56) References Cited

U.S. PATENT DOCUMENTS

| 5,506,515 | * | 4/1996 | Godshalk et al. | 324/762 |
| 5,565,788 | * | 10/1996 | Burr et al. | 324/762 |

FOREIGN PATENT DOCUMENTS

| 62-141741 | 6/1987 | (JP) . |
| 62-279650 | 12/1987 | (JP) . |
| 63-152141 | 6/1988 | (JP) . |
| 63-124668 | 8/1988 | (JP) . |
| 64-21309 | 2/1989 | (JP) . |
| 64-23109 | 2/1989 | (JP) . |
| 64-46755 | 3/1989 | (JP) . |
| 3-158764 | 7/1991 | (JP) . |
| 4-206845 | 7/1992 | (JP) . |
| 7-191058 | 7/1995 | (JP) . |
| 7-311220 | 11/1995 | (JP) . |
| 7-318585 | 12/1995 | (JP) . |
| 8-233860 | 9/1996 | (JP) . |
| 8-233861 | 9/1996 | (JP) . |
| 8-248063 | 9/1996 | (JP) . |
| 10-104275 | 4/1998 | (JP) . |
| 63-124668 | 8/1998 | (JP) . |

* cited by examiner

Primary Examiner—Safet Metjahic
Assistant Examiner—Anjan K Deb
(74) Attorney, Agent, or Firm—Foley & Lardner

(57) ABSTRACT

In a tip portion structure basically having a substrate, a plate spring, and a ground block, the substrate is attached to a signal line on a back surface of the substrate and is contacted on the tip with the signal electrode of the DUT placed on a device stage. The plate spring is made of a resilient material, placed on the front side of the substrate, and positioned to apply a pressure to the substrate. The ground block is positioned between the signal line and the device stage functioned as a ground electrode of the DUT. Alternatively, the tip portion structure further may have a ground plate or a ground surface formed of a conductive thin plate covering entirely the front surface of the substrate, and shaped to surround the signal line in cooperation with the ground block . A plurality of the signal lines may be arranged in parallel on the same plane of the substrate. Another tip portion structure is based on a coaxial cable to be cut from the center at a plane perpendicular to the axial direction thereof along one or more oblique plane. A metal ring fitted over a periphery of the coaxial outer conductor may be used.

22 Claims, 14 Drawing Sheets

TIP PORTION STRUCTURE OF HIGH-FREQUENCY PROBE AND METHOD FOR FABRICATION PROBE TIP PORTION COMPOSED BY COAXIAL CABLE

BACKGROUND OF THE INVENTION

1. Field of the Invention

The present invention relates to a high-frequency probe having a signal line which has a fore end pressed against a single electrode of a device-under-test (abbreviated to DUT hereafter) to be measured, and a rear end connected to a connector for connection to an external measuring instrument.

The present invention specially relater to a high-frequency probe for use in measurement of a DUT, which is placed on a device stage establishing electrical connection with a ground electrode of the DUT and serving as a ground electrode and which bas a number of signal electrodes arrayed with a narrow pitch. More particularly, the present invention relates to a tip portion structure of a high-frequency probe and a method of fabricating a probe tip portion, which can provide contact with the signal electrodes and electrical characteristics with higher reliability and more stability.

2. Description of the Related Art

Hitherto, as illustrated in FIGS. 1A and 1B, a high-frequency probe 100 of the above-mentioned type comprises a body block 110, a tip portion 120, and a connector 130. A coaxial cable 111 penetrating the body block 110 is connected to the connector 130 for electrical connection which connects an external measuring instrument and the tip portion 120 brought into contact with signal electrodes of a DUT to be measured.

Further, as illustrated in FIG. 2, the tip portion 120 comprises a signal contact lead 121 and two ground contact lead 122, each of which has resiliency. The ground contact lead 122 and arranged side by side on both sides of the signal contact lead 121 and on substantially the same plans normal to a direction in which the conductors bond due to resiliency. Thus the signal contact lead 121 and the ground contact leads 122 are formed in a coplanar structure.

Usually, the signal contact lead 121 at the center serves as a contact lead for a signal and is brought into contact with a signal electrode 211 of a DUT 210. On the other hand, the ground contact leads 122 on both sides of the signal contact lead 121 serve as ground contact leads and are brought into contact with ground electrodes 212 of the DUT 210.

In case that the probe tip portion h such a conductor ray structure, the DUT is limited to a coplanar type device wherein signal electrodes and ground electrodes are arranged on the same plane and with the same pitch as conductors arranged in a tip portion of a high-frequency probe.

A large surface area is required in the device of the above-mentioned type having two ground electrodes arranged on both sides of one signal electrode and on the same plane. For compound devices obtained from a wafer of gallium arsenide (GaAs), in particular, the wafer cost is higher than that of a silicon wafer, Therefore, a reduction in the number of devices obtained from one piece of wafer considerably pushes up the device cost. Accordingly, a mass-produced device is constructed such that ground electrodes are not disposed on the same plane as a signal electrode, and uses its backside surface as a ground electrode. In addition, a chip area is reduced and a wafer thickness is thinned to cut down the devise cost and to ensure a desired high-frequency characteristic.

In a case that the conventional high-frequency probe described above is employed to measure a DUT of such a structure that the backside surface entirely serves as a ground electrode, any contact between electrodes of the DUT and contact leads of a probe tip portion cannot be achieved. Accordingly, the measurement is performed for the DUT mounted on a board. In this case, the board has measuring electrodes arranged with the same pitch as the contact leads of the high-frequency probe, and the high-frequency probe can be connected to the board.

Also, in the probe having the above tip portion structure, pressing forces are applied to the electrodes of a DUT in an unstable condition because the probe contact leads are pressed against the DUT electrodes with any one electrode serving as a fulcrum. Such an unstable condition may damage the contact lead ends of the probe due to application of an excessive pressure.

The conventional high-frequency probe described above has therefore problems as follows.

The first problem is that the measurement is very difficult or impracticable when the signal electrode and the ground electrodes of the DUT to be measured are not arranged on the same plane.

The reason is because the contact leads of the probe are arranged side by side on the same plane for making contact with the DUT electrodes. Further, because the contact leads of the probe has the pitch in match with the array pitch of those DUT electrodes, the contact leads cannot contact with DUT electrodes having other structures not in match with that pitch.

The second problem is that, in case of the DUT not having a coplanar structure, a measuring board must be prepared and the measurement requires time and labor.

The reason is because the above-described high-frequency probe has the signal contact lead and the ground contact leads which are of the coplanar structure. In other words, for a measuring DUT of any structure different from the coplanar type, a measuring board is necessary and the DUT being measured requires to be mounted and dismounted to and from the measuring board. For the DUT having a structure wherein a number of signal electrodes are arrayed with a narrow pitch, particularly, a lot of time and labor are taken for wiring job.

The third problem is that a sufficient contact pressure is not obtained in a case that the contact lead of the probe is pressed against the electrode of the DUT for measurement. Thus resulting is an instability in measurement of electrical characteristics, and the contact lead of the probe is susceptible to damage.

The reason is because the above-described high-frequency probe has the structure wherein the contact lead contacts the signal electrode of the DUT under measurement and bends at a freely-suspended end. As, because a pressing force is exerted on the contact lead of the probe to bend its end about a fulcrum positioned on the contact lead, it is difficult to adjust the pressing force. Stated otherwise, the pressing force must be somewhat moderated in view of such a risk that damage may occur at the end of the contact lead if the pressing force is intensified to make stable measurement.

The fourth problem is that the DUT has an increased area and the product cost is increased.

The reason is because, for measuring a DUT by the above-described high-frequency probe, ground electrode of the DUT requires to be arranged on both sides of a signal electrode thereof on the same plane in the same positional relationship as that between a signal contact lead and ground contact leads of the probe. In the words, because a surface area of the DUT is increased, the number of DUTs produced frog one piece of wafer is reduced. The fourth problem is particularly remarkable in a case that the DUT is a compound device of gallium arsenide being more expensive than silicon.

Meanwhile, U.S. Pat. No. 5,506,515 discloses a simplified structure of the tip portion of the high-frequency probe of the above-described type. The disclosed structure of the tip portion of the high-frequency probe is illustrated in FIG. 3. In the figure, a coaxial cable 140 has a cross section surface at its end and comprises a coaxial inner conductor, a coaxial outer conductor, and a dielectric interposed between both the conductors, which are in a concentric relation.

Specifically, the coaxial cable 140 comprises three concentric parts, i.e., a coaxial inner conductor 141 at the axial center, a coaxial outer conductor 142 at an outer periphery, and a dielectric 143 interposed between both the conductors 141 and 142. The end of the coaxial cable 140 is cut perpendicularly to the coaxial direction to provide a cross section portion 144. A central contact lead 151 is fixedly connected to the coaxial inner conductor 141, while outer contact leads 152 are positioned on both sides of the central contact lead 151 and are fixedly connected to the coaxial outer conductor 142.

A description will now be lade on the tip portion structure of the high-frequency probe of the above-described type and a method fabricating the probe tip portion with reference to FIG. 4A to FIG. 4D in addition to FIG. 3, FIG. 4A to FIG. 4D are bottom views looking, from the back side, the probe tip portion illustrated in the perspective view of FIG. 3 and illustrating one example of successive fabricating steps.

First, FIG. 4A shows a state after a stop of cutting the coaxial cable 140 in a plane normal to the axial direction to form the cross section portion 144.

Then, FIG. 4B shows a state after a stop of cutting out a semi-cylindrical portion from the and of the coaxial cable 140 along a plane containing the axis and a plane perpendicular to that plane. Thus defining is a longitudinal cut surface 145 containing the axis, and a halt cross section 146 perpendicular to the longitudinal cut surface 145.

Thereafter, in a step illustrated in FIG. 4C, a frame component 150 is positioned on and fixedly connected to the longitudinal cut surface 145. The frame component 150 is formed by machining together with the central contact lead 151, the outer contact leads 152, and a base plate 153. The base plate 153 supports those leads such that the outer contact leads 152 are positioned on both sides of the central contact lead 151. And the outer contact loads 152 are connected to the coaxial outer conductor 142 in the longitudinal cut surface 145 in a state that the central contact lead 151 is connected to the coaxial inner conductor 141 in the longitudinal cut surface 145.

Finally, in a step illustrated in FIG. 4D, the base plate 153 is no longer needed and is cut off from the contact leads, whereby the tip portion structure illustrated in FIG. 3 is completed.

The above method of fabricating the tip portion structure of the conventional high-frequency probe requires the frame component including the contact leads in addition to the coaxial cable. The frame component includes one central contact lead, two outer contact leads, and a base plate. Therefore, the above method requires the steps of fixedly connecting the one central contact lead to one coaxial inner conductor of the coaxial cable and the two outer contact leads to one coaxial outer conductor thereof, respectively, and then cutting off the base plate from the contact leads. In other words, the frame component in the preparatory step has a complicated shape, and the completed tip portion has a relatively large number of parts. This raises a problem that the fabricating process is complicated and the product cost is increased.

Otherwise, the DUT is downsized and has a large number of signal electrodes arrayed with a narrow pitch and a ground electrode brought into contact with a device stage serving as a test or measure t stage. In this case, a tip portion of a high-frequency probe adapted for such a DUT can also be fabricated by using a coaxial cable and a frame component with contact leads and applying the fabricating method described above. A similar problem as described above however still remains.

SUMMARY OF THE INVENTION

It is an object of the present invention to provide a tip portion structure which is useful as a high-frequency probe and which can solve the above-described problems.

It is another object of the present invention to provide a method of fabricating a tip portion structure as described above in a very simple manner.

According to an aspect of the present invention, a tip portion structure of a high-frequency probe to which the present invention in applicable has a signal line which has a fore end pressed against a signal electrode of a DUT (device-under-test) being placed on a device stage, and a rear end connected to a connector for connection to an external measuring instrument. The tip portion structure comprises a tip substrate having a front surface and a back surface attached to said signal line formed on the back surface, a conductive thin ground plate covering entirely the front surface of the tip substrate, a plate spring positioned to apply a pressure to the tip substrate in a state that the fore end of the signal line is pressed against the signal electrode of the DUT, and a conductive ground block positioned with a predetermined gap against the back surface of the tip substrate, and contacting with a ground surface of the device stage to establish electrical connection in a state that the fore end of the signal line is pressed against the signal electrode of the DUT.

According to another aspect of the present invention, a method is for use in fabricating a tip portion of a high-frequency probe formed of a coaxial cable comprising a coaxial inner conductor, a coaxial outer conductor, and a dielectric interposed between the coaxial inner conductor and the coaxial outer conductor in a concentric relation. The method comprises forming a cross section surface by cutting the coaxial cable at a plane perpendicular to the axial direction of the coaxial cable, forming a oblique cut surface by cutting the cross section surface from substantially the center thereof along at least one oblique plane with respect to the axial direction of the coaxial cable, fixing a ring made of a conductive material over a periphery of the coaxial outer conductor to establish electrical co notion with the coaxial outer conductor, and bonding a contact bump to the coaxial inner conductor exposed in the cross section surface. The fixing of ring and the bonding contact bump are executed one after the other in this order or in the reversed order.

DESCRIPTION OF THE PREFERRED EMBODIMENTS

A first embodiment of the present invention will be described below with reference to the drawings.

Figure 1A:
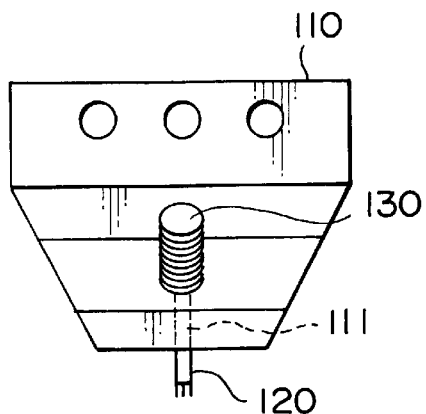
FIGS. 1A and 1B show a front view and a side view illustrating one simple of a conventional high-frequency probe.
Figure 1B:
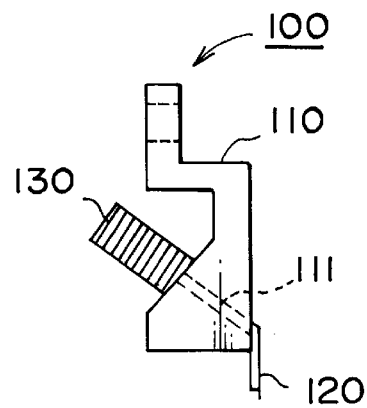
Figure 2:
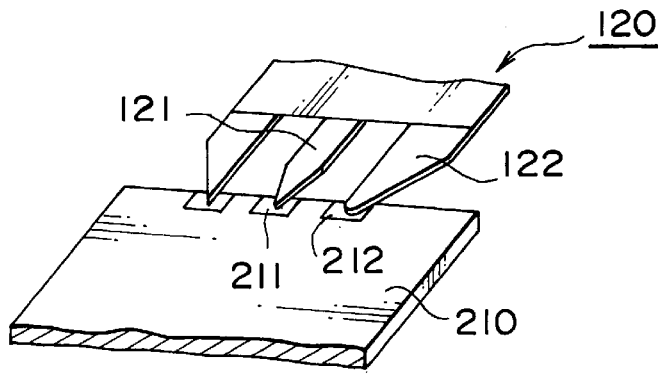
FIG. 2 is a perspective view of the conventional high-frequency probe in a state where a probe tip contacts electrodes of a DUT.
Figure 3:
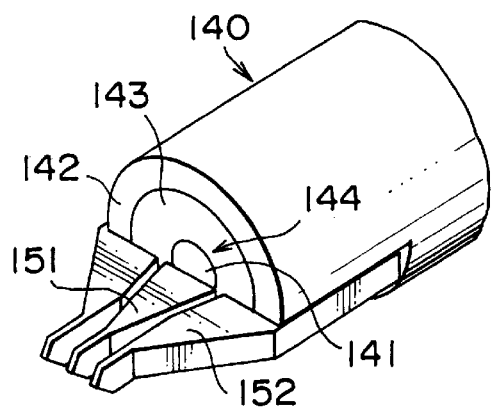
FIG. 3 is a perspective view illustrating one example of a structure of a conventional high-frequency probe using a coaxial cable.
Figure 4A:
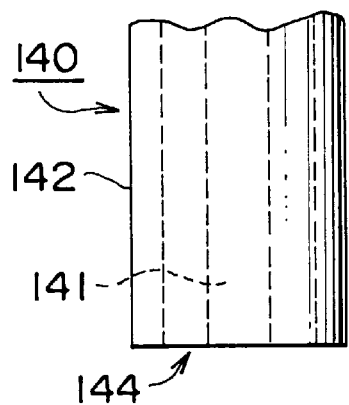
FIG. 4A is a bottom view of the conventional probe in a state after a preparatory step, illustrating one example of a process for fabricating the structure illustrated in FIG. 3.
Figure 4B:
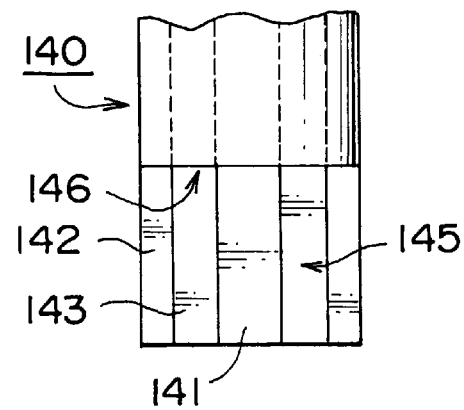
FIG. 4B is a bottom view of the conventional probe in a state after a cutting stop for two surfaces subsequent to the state of FIG. 4A.
Figure 4C:
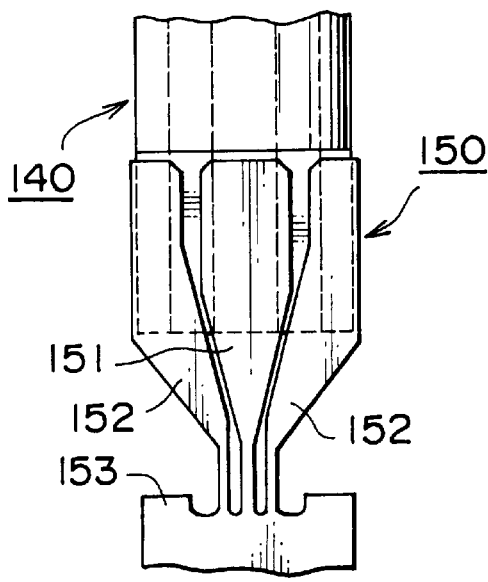
FIG. 4C is a bottom view of the conventional probe in a state after a frame component mounting stop subsequent to the state of FIG. 4B.
Figure 4D:
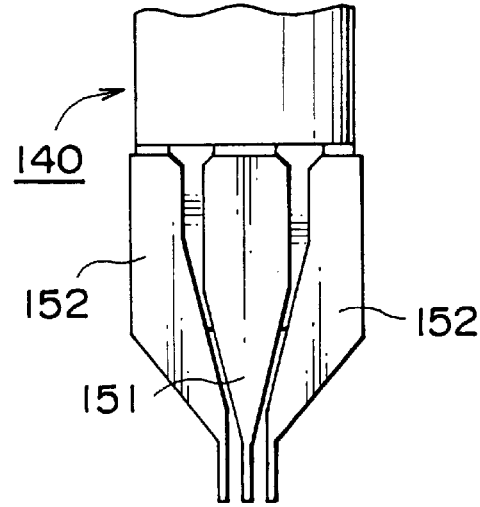
FIG. 4D is a bottom view of the conventional probe in a state after a finishing step subsequent to the state of FIG. 4C.
Figure 5:
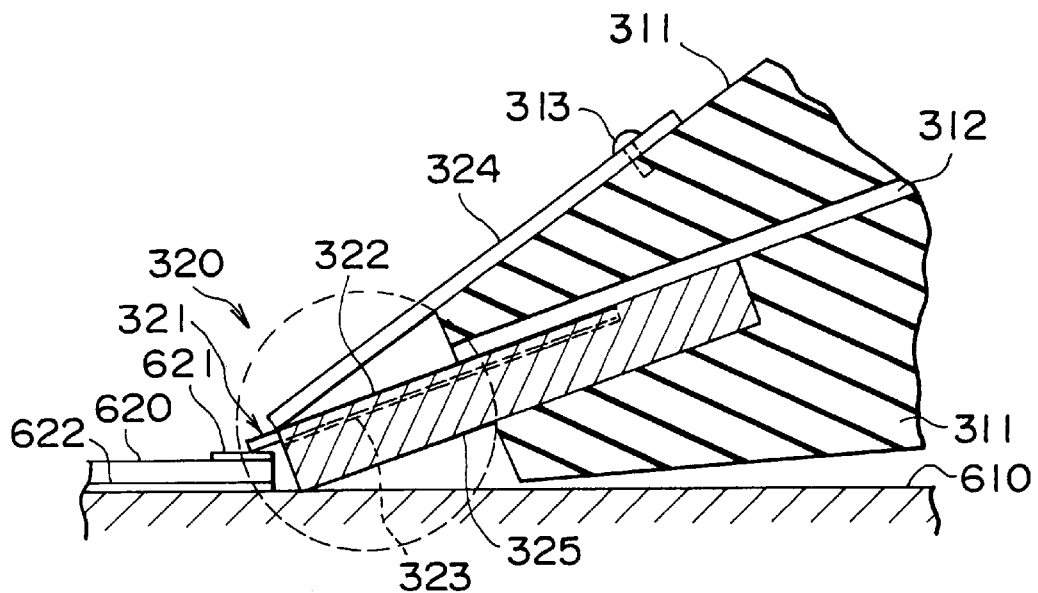
FIG. 5 is a partial sectional side view illustrating a tip portion of a high-frequency probe according to a first embodiment of the present invention.
Figure 6:
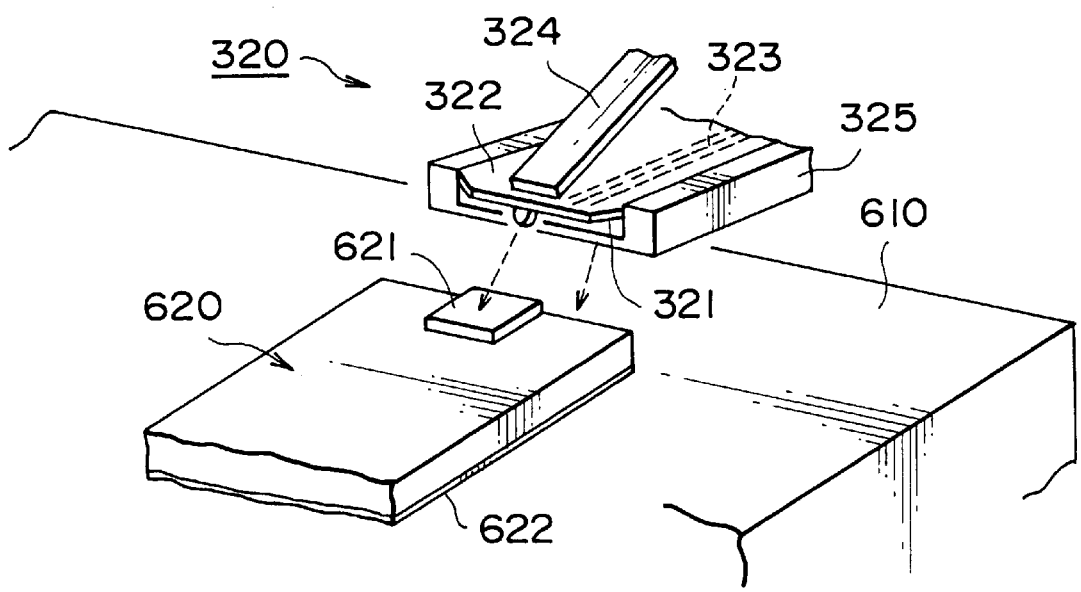
FIG. 6 is a perspective view for explaining the structure and operation of the probe tip portion illustrated in FIG. 5.

FIG. 5 is a partial sectional side view illustrating a tip portion 320 of a high-frequency probe according to the first embodiment of the present invention, and FIG. 6 is a perspective view for explaining the structure and the operation of the tip portion 320 illustrated in FIG. 5.

First, an outline of the tip portion structure of the high-frequency probe according to the first embodiment will be described with reference to FIG. 5 and FIG. 6.

The tip portion 320 of the high-frequency probe illustrated in the drawings comprises a tip substrate 321, a plate sprig 324, and a ground block 325. A DUT 620 has a microstrip structure having a signal electrode 621 formed on the front side thereof and a ground electrode 622 formed on the backside thereof to establish electrical connection with the surface of a device stage 610.

The tip substrate 321 to be the substrate in the summary described above is in the form of a thin film made of a material, e.g., a polyimide resin, which has a small dielectric constant and enables the film to bend in a direction perendicular to the film surface. The tip substrate 321 has a microstrip structure having a signal line 323 forward on one surface thereof brought into contact with the signal electrode 62 and a ground surface 322 formed entirely over the other surface thereof. The ground surface 322 is forming the ground plate in the summary described above.

Although the tip substrate 321 bends, a constant spacing is maintained between the signal line 323 and the ground surface 322. Therefore, characteristic impedance of the tip substrate 321 does not vary. One (fore) end of the signal line 323 is pressed against the signal electrode 621 of the DUT 620, which is placed on the surface of the device stage 610.

And the other (rear) end of the signal line 323 is electrically connected to a signal line on a substrate 312, which extends though a body block 311. Thus electrical connection of a signal coaches through the substrate 312 to a connector for connection to an external measuring instrument.

On the other hand, the plate spring 324 in the summary described above has a plane form and is bendable in a direction coincident with the bending direction of the tip substrate 321. One end of the plate spring 324 is fixed to the body block 311 by a screw 313. And the other end of the plate spring 324 is held against the ground surface 322 of the tip substrate 321 at a position near its fore end. And the fore and of the signal line 323 is pressed against the signal electrode 621 under a predetermined pressing force.

Further, the tip substrate 321 and the ground block 325 are both fixed to the body block 311 and the substrate 312. At the same time, the ground surface 322 and the signal line 323 are also both fixed which are formed respectively on the opposite surfaces of the tip substrate 321. In a fixed state, the ground surface 322 establishes electrical connection with the ground block 325, and also establishes electrical connection with a ground line of the substrate 312.

The signal line 323 is fixedly positioned in a space defined by the ground block 325, and establishes electrical connection with the signal line on the substrate 312.

Accordingly, in a state that the fore end of the signal line 323 is pressed to establish electrical connection against the signal electrode 621 of the DUT 620 placed on the surface of the device stage 610, the fore end of the ground block 325 is pressed against the surface of the device stage 610 to establish electrical contact with the ground electrode 622 of the DUT 620. On the other hand, the ground block 325 is connected to the ground surface 322 to the tip substrate 321, through the shortest distance, and is then connected to the external measuring instrument through the ground line on the substrate 312 and the connector (not illustrated).

The operation and function of the probe tip portion will be next described with reference to FIG. 6.

First, in a state that the signal line 323 in the tip substrate 321 is pressed into contact with the signal electrode 621 of the DUT 620, the tip substrate 321 bends. The bend of the tip substrate 321 is restrained by the plate spring 324 so that a certain contact pressure is applied to the signal electrode 621.

Simultaneously, the ground block 325 is pressed against the surface of the device stage 610 held in contact with the ground electrode 622 of the DUT 620. Thus the ground block 325 enables the ground surface 322 to establish, through the shortest distance, electrical contact with the device stage 610 held in contact with the ground electrode 622 of the DUT 620. Further, even with the bend of the tip substrate 321 in the form of a thin film, the transmission line of the high-frequency probe suffers from no variation in characteristic impedance because both the ground surface 322 and the signal line 323 bend at the same tin.

An embodiment modified from that illustrated in FIG. 6 will be next described with reference to FIG. 7.

Figure 7:
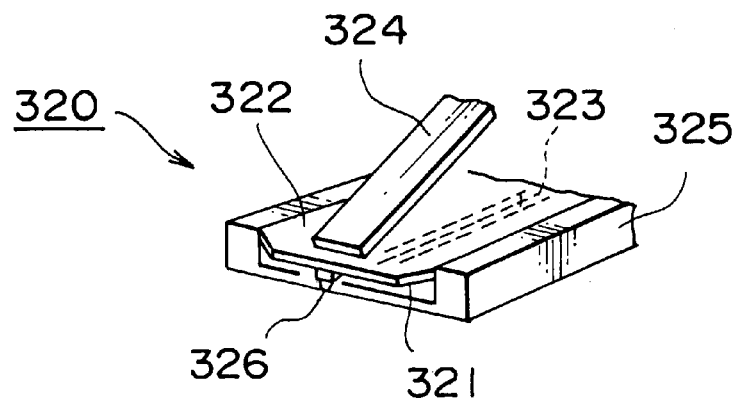
FIG. 7 is a perspective view illustrating a probe tip portion according to an embodiment modified from that illustrated in FIG. 6.

The modified embodiment illustrated in FIG. 7 differs in a contact bump 326 from the embodiment illustrated in FIG. 6. That is, the contact bump 326 is made of a conductive material such as a metal, and is provided at the fore end of the signal line 323 domed in the tip portion 320 described above. And the fore end of the signal line 323 is brought into contact with the signal electrode 621 of the DUT 620. Accordingly, the provision of contact bump 326 ensures electrical connection with the signal electrode 211 more reliably.

Another modified embodiment including a plurality of signal lines unlike the embodiments illustrated in FIG. 6 and FIG. 7 will be next described with reference to FIG. 8.

Figure 8:
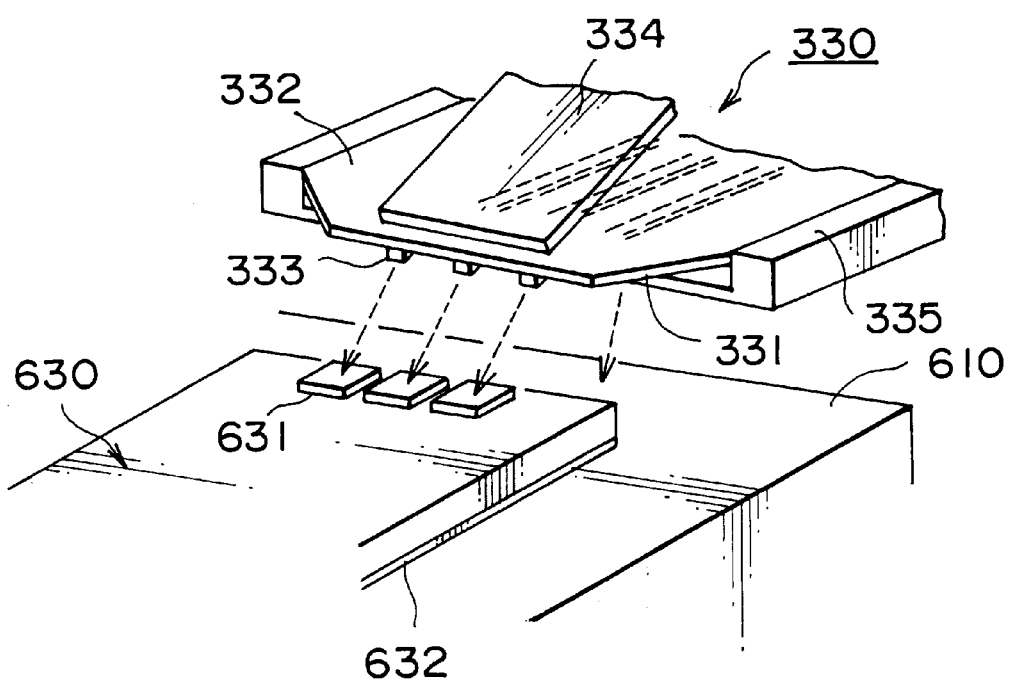
FIG. 8 is a perspective view for explaining a tip portion structure having a plurality of signal lines in the tip portion structure illustrated in FIG. 6.

The modified embodiment illustrated in FIG. 8 differs in three signal lines 333 in the tip portion 330 from the embodiment illustrated in FIG. 6. The three signal lines 333 are arranged on one surface of a tip substrate 331 parallel to each other. Accordingly, the tip substrate 331 and a ground block 335 surrounding the tip substrate 331 are structured to have a larger width than that of the tip substrate 321, illustrated in FIG. 6, in the direction in which the plurality of signal lines 333 are arranged. A plate spring 334 instead of the plate spring 324 in FIG. 7 may also have a large width corresponding to the wide tip substrate 331. A DUT 630 has a ground electrode 632 formed on the backside thereof, and a nor of signal electrodes 631 with a narrow pitch. With such a structure, the DUT 630 can be measured by placing it on the device stage 610 at the ground potential.

Figure 9:
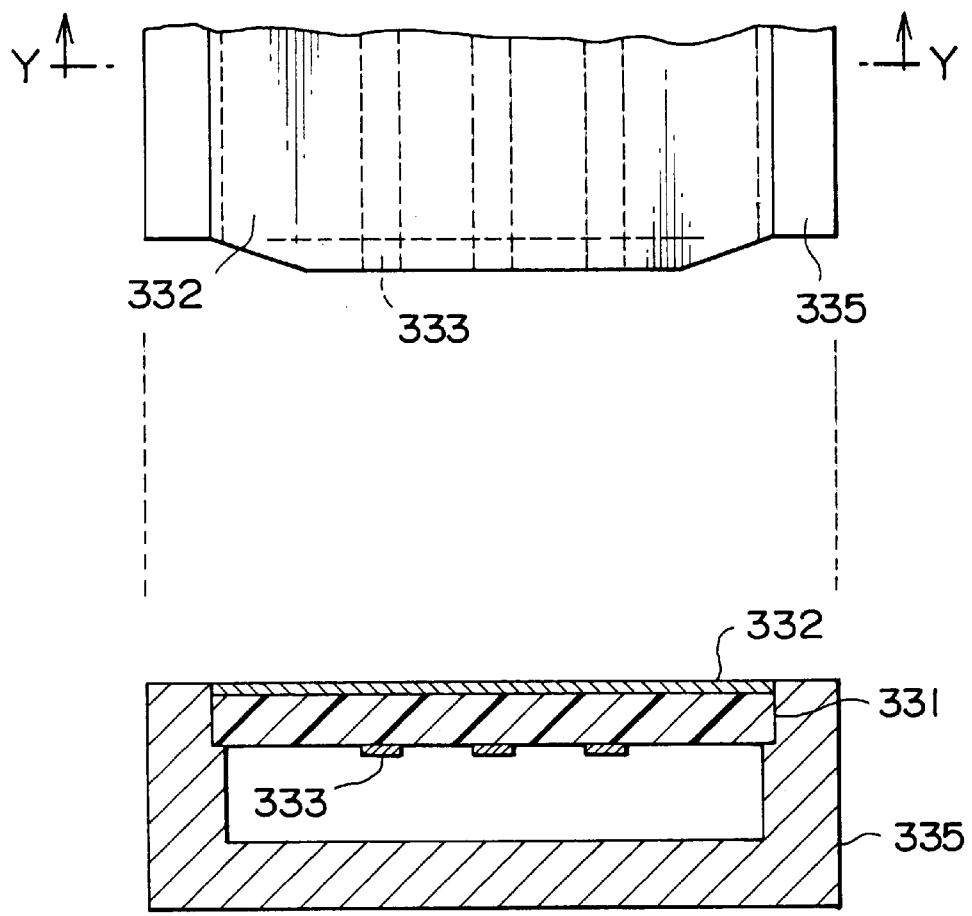
FIG. 9 shows a partial view of the tip portion structure illustrated in FIG. 8, and a sectional view taken along line Y—Y in the partial view.

With reference to FIG. 9, a description will be next made on a structure having the plurality of signal lines 333 and including a ground wall formed by the ground block 335 to surround the tip substrate 331.

The structure of FIG. 9 intends to measure a high-frequency characteristic with higher accuracy and more stability The structure of FIG. 9 is illustrated and described in connection with the probe tip having a plurality of signal lines. But it is to be here noted that the structure can also be similarly applied to the probe tip having one signal line illustrated in FIG. 6.

FIG. 9 shows a partial view of only a tip portion 330 illustrated in FIG. 8, and a sectional view taken along line Y—Y in the partial view. As described above with reference to FIG. 8, the tip substrate 331 in the form of a thin film has three signal lines 333 arranged on the back side thereof, i.e., on the hidden side in the partial view. A ground surface 332 is fore entirely over the front side thereof. The tip substrate 331 is positioned with the signal lines 333 located on the inner side, and serves as a lid for an inner space defined by the ground block 335 in the form a gutter shaped in cross-section. With such a structure, the signal lines 333 are surrounded by the ground surface 332 and the ground block 335 except their foremost ends brought into contact with the signal electrodes of the DUT, while a certain spacing is left between the signal lines 333 and the ground block 335. As a result, the tip portion structure is simplified and the production cost can be held down.

An embodiment codified from that illustrated in FIG. 9 will be next described with reference to FIG. 10.

Figure 10:
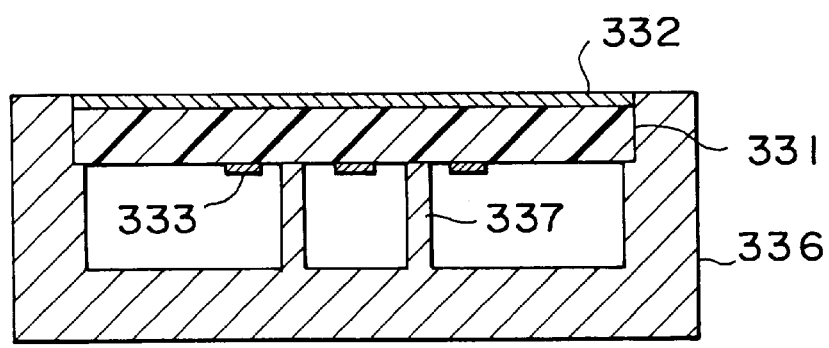
FIG. 10 is a sectional view illustrating a tip portion structure according to an embodiment modified from that illustrated in FIG. 9.

The modified embodiment illustrated in FIG. 10 differs in a ground block 336 from that illustrated in FIG. 9. Specifically, the ground block 336 illustrated in FIG. 10 includes ground walls 337 additionally formed to position between the adjacent signal lines 333 and to electro-magnetically isolate the signal limes 333 arranged parallel to each other. Such a structure contributes to reducing crosstalk noise between the signal lines 333 respectively.

Next, a second embodiment of the present invention will be described below with reference to the drawings. In the second embodiment, a signal line connecting between a probe tip portion arid a connector is formed of a coaxial cable. Note that the drawings referred to below to explain a tip portion structure are schematic views deformed for illustrative purposes, and a relative relation in size of parts is only by way of reference.

Figure 11:
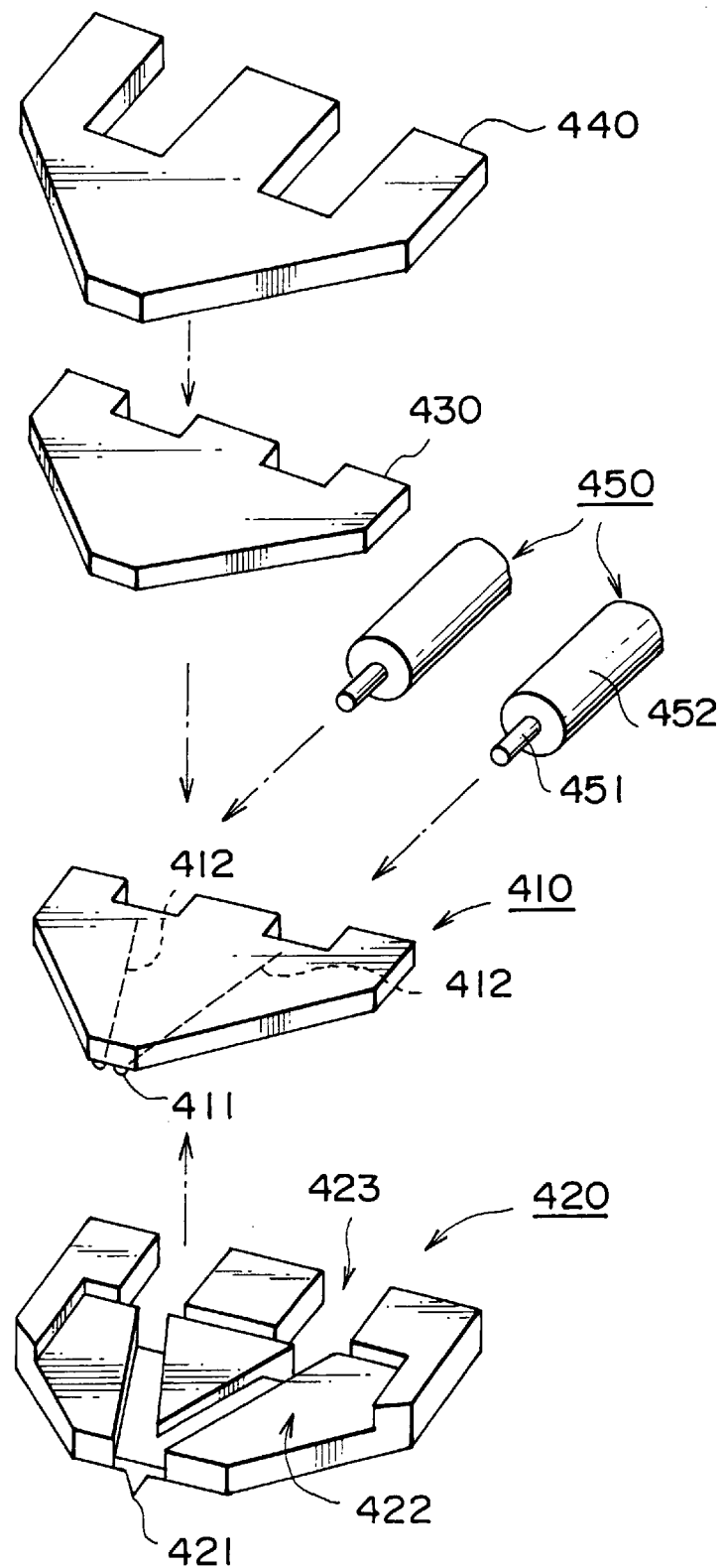
FIG. 11 is an exploded perspective view illustrating a tip portion structure of a high-frequency probe according to a second embodiment of the present invention.
Figure 12:
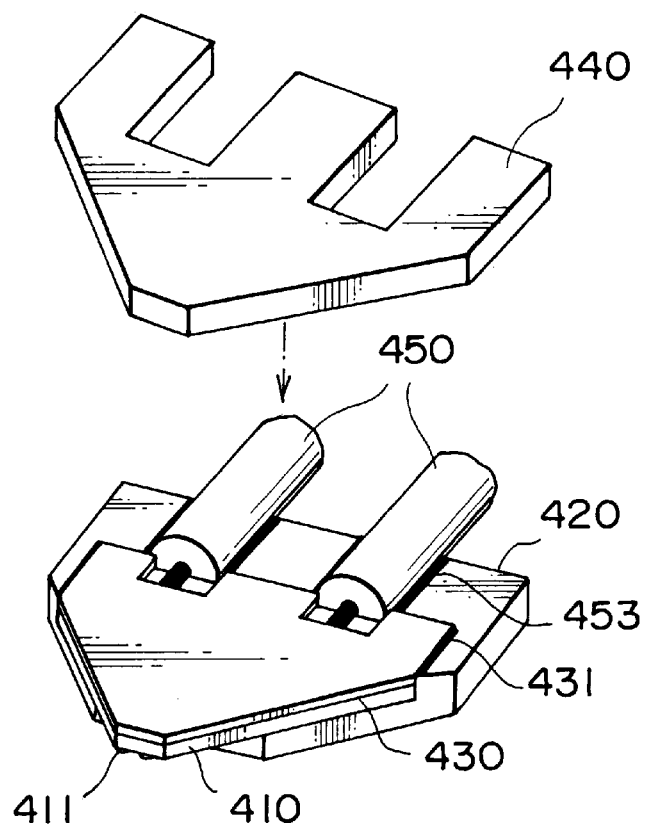
FIG. 12 is an exploded perspective view of the tip portion structure in which parts illustrated in FIG. 11 are assembled except an upper absorber.

FIG. 11 and FIG. 12 are exploded perspective views illustrating the second embodiment of the present invention.

A tip portion structure of a high-frequency probe illustrated in FIG. 11 is assembled by placing a substrate 410, a lower absorber 420, a ground plate 430, and an upper absorber 440, on above another in the order named. During the assembling process, two coaxial cables 450 are fitted to the lower absorber 420. The substrate 410 has signal contact bumps 411 and signal line 412. The lower absorber 420 has a ground contact bump 421, a substrate stand 422, and guide grooves 423. The coaxial cable 450 comprises a coaxial inner conductor 451 and a coaxial outer conductor 452.

Figure 13:
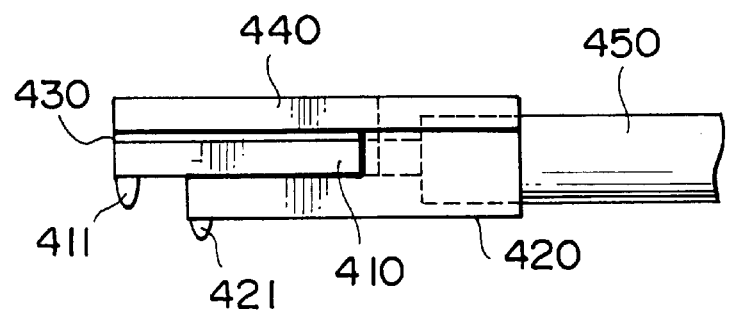
FIG. 13 is a side view of a completed assembly of the parts illustrated in FIG. 11.

In the exploded perspective view of FIG. 12, the upper absorber 440 is illustrated as being separated from an assembly obtained by assembling the substrate 410, the lower absorber 420 and the ground plate 430 together with the two coaxial cables 450, illustrated in FIG, 11. And they are fixed by brazing. FIG. 13 is a side view of a completed assembly of the parts illustrated in FIG. 11.

The substrate 410 is in the form of a flat plate. The substrate 410 has a front surface and a back surface parallel to axes of the two coaxial cables 450 connected to a proximal portion of the substrate 410, and which has a distal portion tapering toward its fore end. The two signal contact bumps 411 are provided at the fore end of the substrate 410 on the back surface. The two signal lines 412 connect respectively the two signal contact bump 411 and the coaxial inner conductors 451 of the two coaxial cables 450 connected to the proximal portion of the substrate 410. The two signal lines 412 (see FIG. 11) are formed of linear strip lines bonded to the back surface of the substrate 410. The substrate 410 is made of a dielectric material, such as a resin or ceramic, for the purpose of easy molding.

The lower absorber 420 to be the ground block in the summary described above is formed of a conductor, and the ground contact bump 421 is bonded to a fore end of the lower absorber 420 on the backside surface. And the lower absorber 420 is fond and positioning the ground contact bump 421 so as to keep the signal contact Lumps 411 exposed in the state that the substrate 410 is fitted to the front side of the lower absorber 420. Accordingly, the substrate stand 422 is formed on the front side of the lower absorber 420 with a wall frame. And at least the proximal portion of the substrate 410 is fitted by the wall frame in such a manner that the signal contact bumps 411 are exposed on the backside of the substrate 410.

The guide grooves 423 have wall frames allowing the coaxial cables 450 to be fitted to a proximal portion of the lower absorber 420. The wall frames of the substrate stand 422 and the guide grooves 423 have flat surfaces perpendicular to the front surface of the lower absorber 420. The substrate 410 and the coaxial cables 450 are moved along the perpendicular flat surfaces of the respective wall frames and then fitted in place. Further, the lower absorber 420 has deep grooves which are formed in the substrate stand 422 to extend along the signal line 412 on the substrate 410 and to define a gap left between the signal line 412 and a ground surface formed by the lower absorber 420.

The ground plate 430 is formed of a conductor and is in the form of a thin plate fully covering the front surface of the substrate 410. The ground plate 430 is fitted to the lower absorber 420 together with the substrate 410, and is bonded at its proximal portion to the lower absorber 420 by brazing 431.

The upper absorber 440 to be the plate spring in the summary described above is formed of a resilient material. The upper absorber 440 is placed on the front side of the lower absorber 420 after the substrate 410 and the ground plate 430 has been fitted to it. The upper absorber 440 is fixed at its proximal portion and thereabout to the lower absorber 420 by, e.g., screwing ox brazing, Now, we take a case that the signal contact bumps 411 of the substrate 410 is brought into contact with signal electrodes of a DUT and is subject to stress acting to make the signal contact bums 411 apart from the ground contact bump 421 of the lover absorber 420. In this case, an appropriate contact pressure is obtained between the signal contact bumps 411 and the signal electrodes of the DUT by selected resiliency of the upper absorber 440. The upper absorber 440 can be made of any suitable material so long as the material can provide an appropriate contact pressure between the signal contact bums 411 and the signal electrodes of the DUT.

Each of the coaxial cables 450 is fitted to the guide groove 423 of the lower absorber 420. The coaxial inner conductor 451 is fixed by, e.g. brazing for electrical connection to the signal line 412 exposed on the hidden side of the substrate 410, an viewed in FIG. 11, which is fitted to the substrate stand 422 of the lower absorber 420. On the other hand, the coaxial outer conductor 452 is fixed in its portion contacting the lower absorber 420 by silver brazing 453 for electrical connection to the ground contact bump 421.

The signal contact bumps 411 are arranged two parallel to each other in a close relation to the fore end of the back surface of the substrate 410 in the form of a flat plate. This structure enables the signal contact bumps 411 to be easily adaptable for the signal electrodes of the DUT which are formed in a fine pattern or of multiple pins.

Figure 14A:
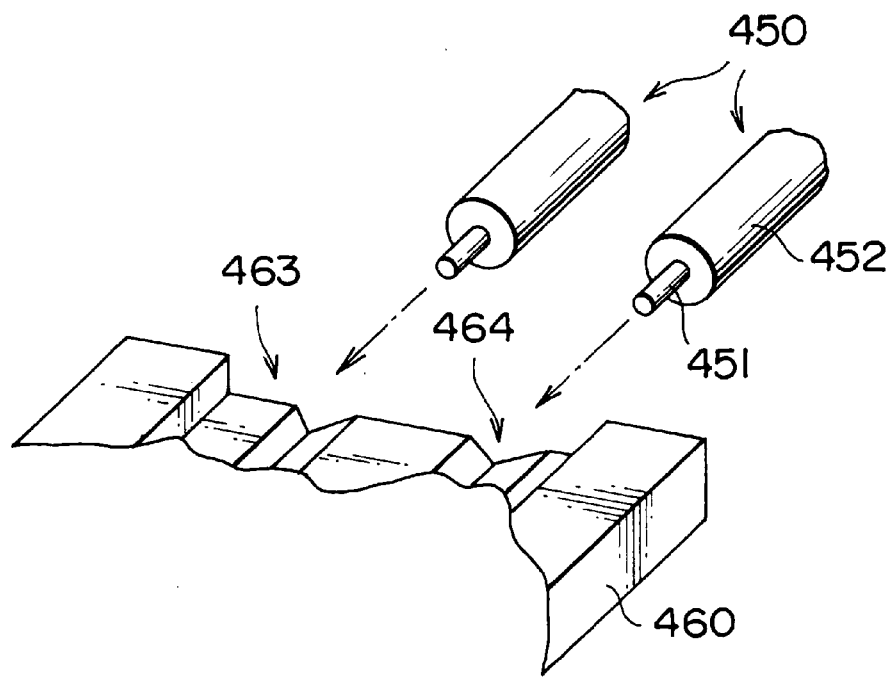
FIG. 14A is a perspective view illustrating a state of fitting coaxial cables to a proximal portion of a lower absorber in an embodiment modified from that illustrated in FIG. 12.
Figure 14B:
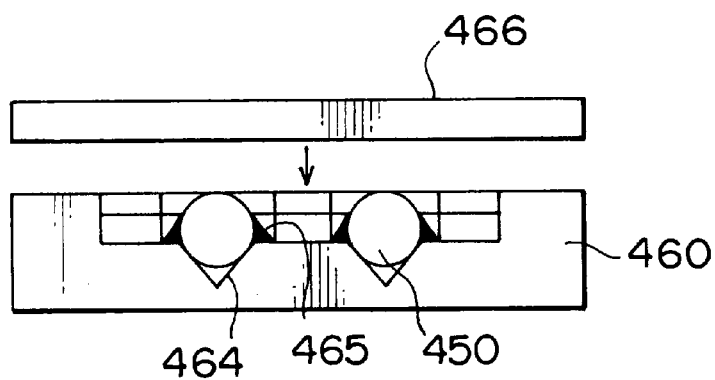
FIG. 14B is a front view of the lower absorber illustrated in FIG. 14A as viewed in the direction facing a proximal end of the lower absorber.

An embodiment modified from that illustrated in FIG. 11 to FIG. 13 will be next described with reference to FIG. 14A and FIG. 14B. FIG. 14A is a perspective view illustrating a state of fitting the coaxial cables 450 to the proximal portion of a lower absorber 460, and FIG. 14B is a front view of the lower absorber 460 as viewed in the direction facing a proximal end of the lower absorber.

While the modified embodiment is similar in general shape and construction to the above-described embodiment, the lower absorber 460 differs in a guide groove 463 and two V-shaped grooves 464 from the lower absorber 420, as illustrated. The guide groove 463 is formed in the proximal portion of the lower absorber 460 on the front side and two V-shaped grooves 464 are formed in the guide groove 463. Further , an upper absorber 466 has a shape in match with that of the lower absorber 460.

The V-shaped grooves 464 are effective to guide and position the coaxial inner conductors 451 of the coaxial cables 450 with respect to the signal line 412 on the substrate 410, illustrated in FIG. 11. This is effectively realized in a case that the coaxial cables 450 are pushed into the guide groove 463 from the front side of the lower absorber 460. As illustrated, the coaxial cables 450 are positioned in the corresponding V-shaped grooves 464 and then fixedly fixed to a contact portion of the lower absorber 460 by silver brazing 465 for electrical connection between the coaxial cables 450 and the lower absorber 460.

While the V-shaped grooves are illustrated and described above, a satisfactory function can also be obtained with relatively deep, linear grooves. The V-shaped grooves many be replaced by U-shaped grooves to which the coaxial cables can be fitted.

While the two coaxial cables are illustrated and described above, the number of coaxial cables may be one, or three or more. The guide grooves or the V-shaped grooves are provided in the lower absorber in number corresponding to the namer of coaxial cables to be arranged. Also, in the above description, the ground plate is separately formed of a flat plate having the same shape as the substrate and is assembled with the substrate. The ground plate and the substrate may be however formed in a one-piece structure.

Further, the upper absorber is ford such that the coaxial cables fitted to the lower absorber are exposed on the front side of the lower absorber to have effective resiliency. Therefore the upper absorber may be formed to cover a part or the whole of the exposed portions of the coaxial cables. The coaxial cable is bonded to the lower absorber by soldering in the above description. But the coaxial cables may be fixed by any other suitable means if complete electrical connection and mechanical fixation can be obtained.

While the shapes and materials of the individual parts are illustrated and described above, the parts may have any other suitable shapes and may be made of any other suitable materials so long as satisfactory functions are obtained. In other words, the above description should not be construed as limiting the scope of the present invention.

Next, a third embodiment of the present invention will be described below with reference to the drawings. In the third embodiment, a tip portion of a high-frequency probe is formed at an end of a coaxial cable with a simple structure.

Figure 15:
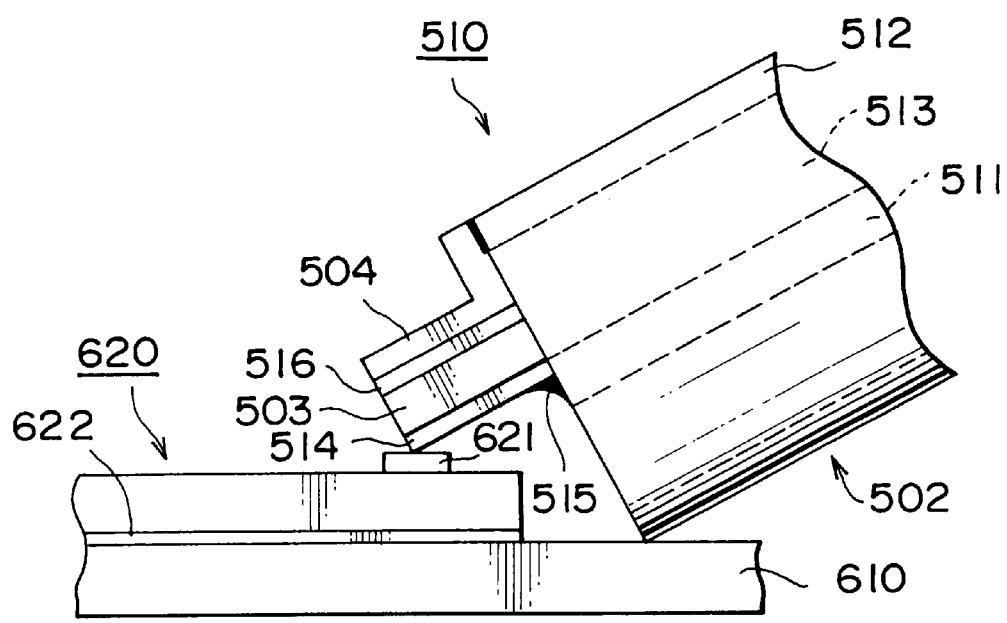
FIG. 15 is a side view for explaining a tip portion structure of a high-frequency probe according to a third embodiment of the present invention.
Figure 16:
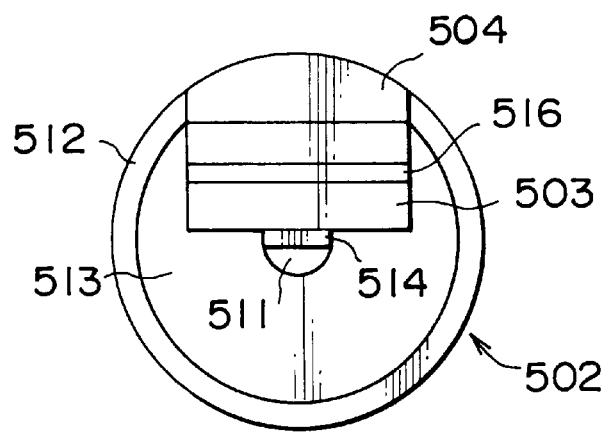
FIG. 16 is a front view of the tip portion structure of the high-frequency probe, illustrated in FIG. 15, as viewed from the side of a DUT under measurement.

FIG. 15 is a side view for explaining the third embodiment of the present invention, and FIG. 16 is a front view of a tip portion structure of a high-frequency probe 510 as viewed from the side of a DUT 620.

In the tip portion structure of the high-frequency probe 510 illustrated in FIG. 15, a substrate 503 is mounted by a bracket 504 to a cross section surface of a coaxial cable 502 which is perpendicular to the axial direction of the coaxial cable 502. The bracket 504 is corresponding to the plate spring in the summary described above.

Furthermore, FIG. 15 shows a manner of high-frequency measurement using the high-frequency probe 510. A DUT 620 has a ground electrode 622 entirely formed on the backside thereof, and is placed on the surface of a device stage 610 which is formed as a ground surface.

The coaxial cable 502 comprises a coaxial inner conductor 511 at the center, a coaxial outer conductor 512 at an outer periphery, and a dielectric 513 interposed between both the conductors, which are in a concentric relation. The coaxial cable 502 has one and face given by the cross section surface of the coaxial cable 502 perpendicular to the axial direction thereof.

In a state after being mounted, the substrate 503 has two surfaces normal to the cross section surface of the coaxial cable 502. A signal line 514 is provided on one surface of the substrate 503 to linearly extend from a proximal end to a distal end of the substrate 503 along the central line. The signal line 514 is hold at the proximal end in close contact with the coaxial inner conductor 511 of the coaxial cable 502 exposed in the cross section surface thereof, and is connected to the coaxial inner conductor 511 for electrical connection by, e.g., soldering 515. The other surface of the substrate 503 is a flat surface and is positioned near the coaxial outer conductor 512. A ground surface 516 to be the ground plate in the summary described above is made of a conductive material and is formed entirely over the other surface of the substrate 503.

The bracket 504 is formed of a plate-like conductor, e.g., a resilient plate, and has an L-shape. One outer surface of the bracket 504 is hold in close contact with a semicircular portion of the cross section surface of the coaxial cable 502, and the other outer surface of the bracket 504 is bonded to the entirely-formed ground surface 516 of the substrate 503. The proximal end of the substrate 503 is held in close contact with the cross section surface of the coaxial cable 502. The bracket 504 is held in close contact with the coaxial outer conductor 512 of the coaxial cable 502, and is connected to the coaxial outer conductor 512 for electrical connection by, e.g., soldering.

The surface of the device stage 610 illustrated in FIG. 15 is formed as a ground surface. In measurement, as illustrated, the DUT 620 to be measured having the ground electrode 622 entirely formed on the back side thereof is placed on the surface of the device stage 610. Therefore, in a state that the signal line 514 is contacted with a signal electrode 621 of the DUT 620, the coaxial outer conductor 512 of the coaxial cable 502 is pressed against the ground surface of the device stage 610. Accordingly, the signal line 514 contacts with the signal electrode 621 as a contact base surface which the coaxial outer conductor 512 contacts with the ground surface of the device stage 610. And a contact pressure applied to the signal electrode 621 can be maintained at a fixed value in a reproducible manner.

As described above, a fore end of the coaxial outer conductor 512 having no resiliency is pressed against the ground surface of the device stage 610 which serves as a contact base surface. Accordingly, the contact pressure applied to the signal electrode 621 is determined depending on the amount of bend of the substrate 503. Also, by giving resiliency to the bracket 504 to which the substrate 503 is fixed, a desired contact pressure can be obtained.

Further, in the above-described tip portion structure of the high-frequency probe 510, the signal line 514 on the substrate 503 is positioned between the entirely-formed ground surface 516 thereof and the ground surface formed as the surface of the device stage 610.

In the above description, the signal line on the substrate is linearly extended and is directly connected to the coaxial inner conductor by soldering. However, the shape, the connected position and the connecting means of the signal line are optionally selected, and are not limited to those described above. Also, while the signal line on the substrate has been illustrated and described as having a flat surface, the surface of the signal line is not limited to the flat surface. Similarly, the shape and the mounting position of the bracket are also not limited to those illustrated and described above.

An embodiment modified from that illustrated in FIG. 15 and FIG. 16 will be next described with reference to FIG. 17A and FIG. 17B in addition to FIG. 15 and FIG. 16.

Figure 17A:
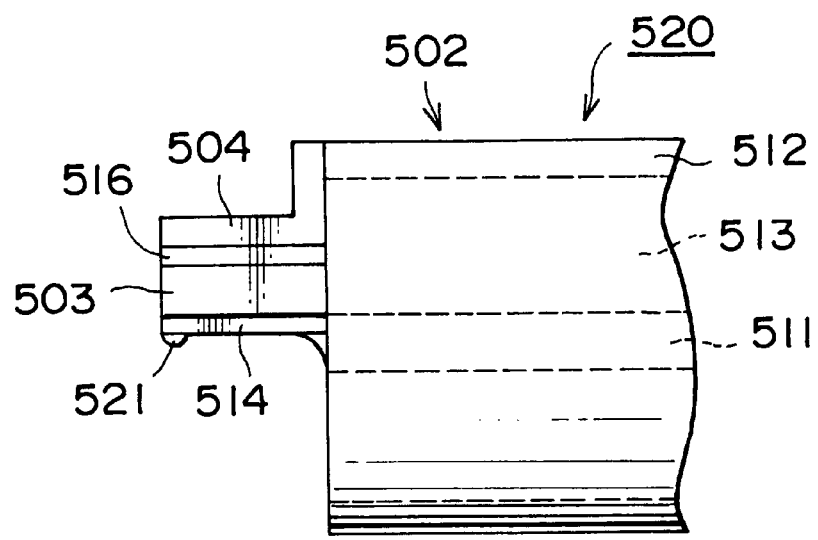
FIG. 17A is a side view illustrating a tip portion structure of a high-frequency probe according to an embodiment modified from that illustrated in FIG. 15.
Figure 17B:
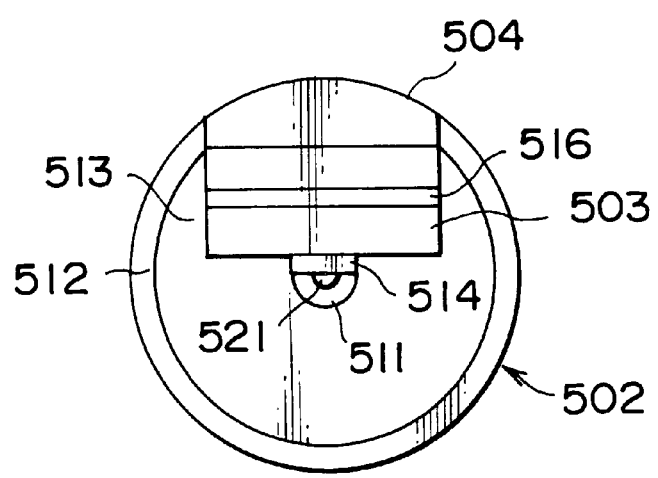
FIG. 17B is a front view of the tip portion structure of the high-frequency probe, illustrated in FIG. 17A, as viewed from the side of a DUT under measurement.

FIG. 17A is a side view illustrating a modification of the above-described third embodiment of the present invention, and FIG. 17B is a front view of a tip portion structure of a High-frequency probe 520 as viewed from the side of a DUT.

The tip portion structure of the high-frequency probe 520 differs in a contact bump 521 from that illustrated in FIG. 15 or FIG. 16. That is, the contact bump 521 made of a metal is provided at a fore end of the signal line 514 which is brought into contact with the signal electrode of the DUT Such a structure renders the signal line to contact the signal electrode of the DUT through a contact bump, and therefore improves reproducibility in position of the contact point of the contact bump on the signal electrode. As a result, reproducibility in measurement can also be improved. The other components may have the same structures and functions as those illustrated in FIG. 15 and FIG. 16 and described above.

An embodiment modified from those illustrated in FIG. 15, FIG. 16, FIG. 17A and FIG. 17B will be next described with reference to FIG. 18A and FIG. 18B in addition to FIG. 15 and FIG. 16.

Figure 18A:
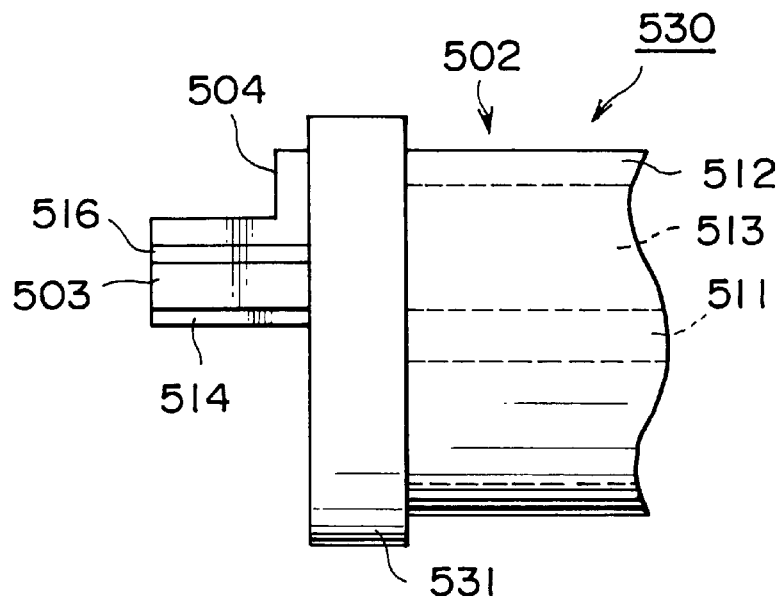
FIG. 18A is a side view illustrating a tip portion structure of a high-frequency probe according to another embodiment modified from that illustrated in FIG. 15.
Figure 18B:
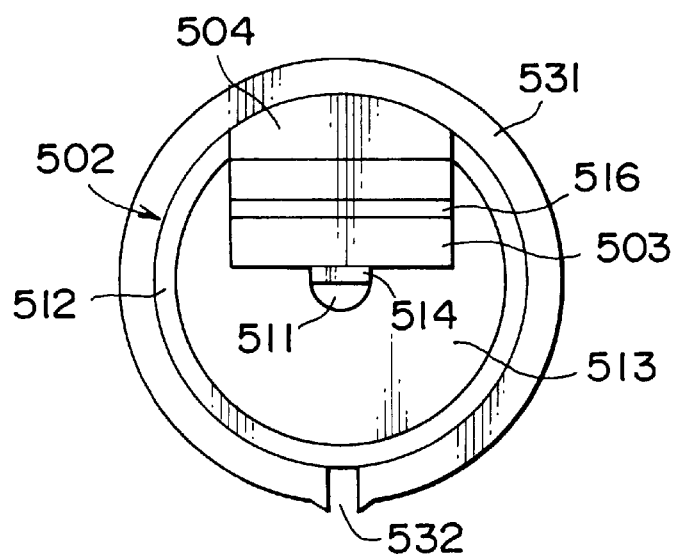
FIG. 18B is a front view of the tip portion structure of the high-frequency probe, illustrated in FIG. 18A, as viewed from the side of a DUT under measurement.

FIG. 18A is a side view illustrating another modification of the above-described third embodiment of the present invention, and FIG. 18B is a front view of a tip portion stricture of a high-frequency probe 530 as viewed from the side of a DUT to be measured.

The tip structure of the high-frequency probe 530 differs in a ring 531 from that illustrated in FIG. 15 or FIG. 16. That is, the ring 531 of such conductive material as metal covers the coaxial outer conductor 512 in a close relation to surround an outer periphery of the cross section surface of the coaxial cable 502 to which the substrate 503 is fixed. This structure prolongs the life of a portion of the coaxial cable 502 brought into contact with the ground surface of the device stage. Also, by forming a slit 532 in a portion of the ring 531 brought into contact with the ground surface of the device stage, the coaxial cable 502 can be contacted with the ground surface with stability. Further, by forming the slit 532 to provide protruding portions, which are brought into contact with the ground surface of the device stage, contact stability and reproducibility in position during probing can be both improved. This results in good reproducibility in measurement. The other components may have the same structures and functions as those illustrated in FIG. 15 and FIG. 16 and described above.

In the above modifications, different components are added to the third embodiment illustrated in FIG. 15 and FIG. 16. However, the contact bump 521 illustrated in FIG. 17A and FIG. 17B and the ring 531 illustrated in FIG. 18A and FIG. 18B may be both provided in the third embodiment.

While the shapes and positions in an assembly of the individual parts are illustrated and described above, the components may have any other suitable shapes and may be assembled in any other suitable positions so long as satisfactory functions are obtained. In other words, the above description should not be construed as limiting the scope of the present invention.

Next, a fourth embodiment of the present invention will be described below with reference to the drawings. In the fourth embodiment, a tip portion of a high-frequency pro is foamed by machining a coaxial cable constituting a coaxial cable, and is realized with a simpler structure.

FIG. 19A to FIG. 19D are explanatory views illustrating successive machining steps of fabricating the tip portion of the high-frequency probe according to the fourth embodiment. The method comprises a cross section forming, an oblique cut surface forming, a ring fixing, and a contact bump bond.

The tip portion of the high-frequency probe comprises a coaxial cable 710. The coaxial cable 710 comprises a coaxial inner conductor 711, a coaxial outer conductor 712, and a dielectric 713 interposed between both the conductors, which are in a concentric relation.

Figure 19A:
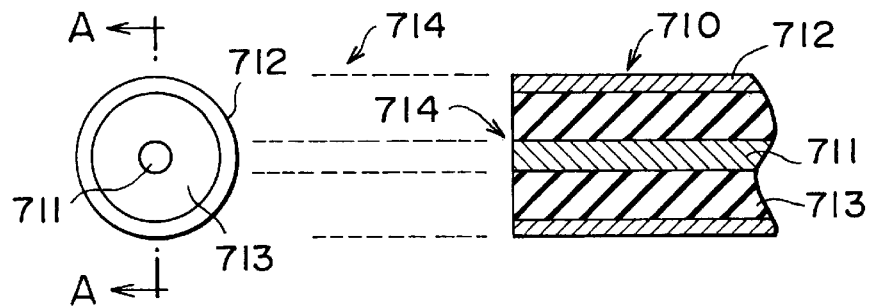
FIG. 19A shows a front view of a tip portion structure of a high-frequency probe according to a fourth embodiment of the present invention in a state after a first step, and a sectional view taken along line A—A in the front view.

In a first fabricating to be the cross section forming, the coaxial cable 710 is cut at a plane perpendicular to the axial direction thereof. As a result, as illustrated in FIG. 19A, a cross section surface 714 is formed at one end of the coaxial cable 710. FIG. 19A shows a front view of the cross section surface 714 of the coaxial cable 710 in a state after the first fabricating, and a sectional view taken along line A—A in the front view.

In a second fabricating to be the oblique cut surface forming, the coaxial cable 710 is cut obliquely with respect to the axial direction, e.g., obliquely downwardly in an illustrated example, along a plan crossing the center of the cross section surface 714 in the circular form. As a result, a first oblique cut surface 715 is formed as illustrated in a sectional view of FIG. 19B.

In a third fabricating to be the ring fixing, a ring 720 made of such a conductive material as a metal, is fitted over a periphery of a coaxial outer conductor 712 of the coaxial able 710 in a close relation so as to establish electrical connection. As illustrated in FIG. 19C, the fitted ring 720 it positioned such that the ring 720 covers a portion of the coaxial outer conductor 712 exposed by forming the first oblique cut surface 715. FIG. 19C shows a front view of the cross section surface 714 of the coaxial cable 710 in a state after the third fabricating and a sectional view taken along line B—B in the front view.

In a final fabricating to be the contact bump bonding, a metal contact bump 730 is bonded to a fore end of the coaxial inner conductor 711 exposed in the first oblique cut surface 715. As a result, the ring 720 and the contact bump 730 form contacts which are independent of each other and are located on the surface side of the first oblique cut surface 715, as illustrated in FIG. 19D. Specifically, the illustrated ring 720 is a resilient member, and has a slit 721 positioned in a plans containing the contact bump 730 and the axis of the coaxial cable 710 on the same side as the contact bump 730. Therefore, the ring 720 established complete electrical connection with the coaxial outer conductor 712 of the coaxial cable 710 due to its own resiliency and also serves as a contact.

Figure 19B:
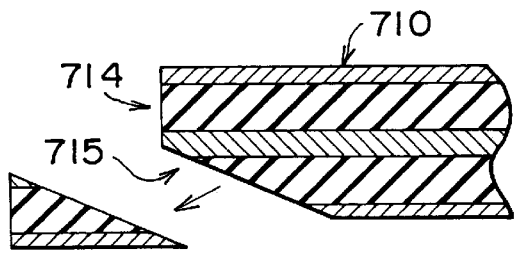
FIG. 19B is a sectional view taken along line A—A in the front view of FIG. 19A in a state after a second step subsequent to the state of FIG. 19A.
Figure 20:
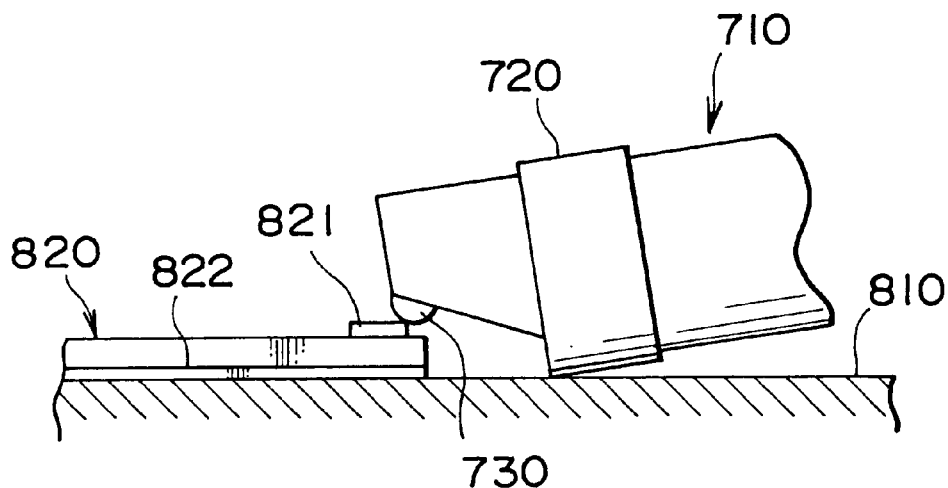
FIG. 20 is a side view of a tip of the high-frequency probe manufactured tough the steps of FIG. 19A to FIG. 19D, illustrating a state of the probe tip portion placed, by way of one example, on a device stage in use.

In measurement, as illustrated in FIG. 20, a DUT 820 to be measured is placed on the surface of a device stage 810 which serves as a device test ground connecting with a ground electrode 822 of the DUT 820. Then, the contact bump 730 of the tip portion of the high-frequency probe described above with reference to FIG. 19B is pressed against a signal electrode 821 of the DUT 820 while the first oblique cut surface 715 is positioned to face the device stage 810. At the same time, a portion of the ring 720 including the slit 721 is also pressed against the device stage 810 to ensure contact with the ground surface. As a result, the tip portion of the high-frequency probe can obtain reliable contacts with a signal electrode and with a ground electrode respectively.

In the sequence of fabricating steps described above, the contact bump is mounted after the ring has been fitted. However, the sequence of steps may be reversed to the above lone.

Figure 19C:
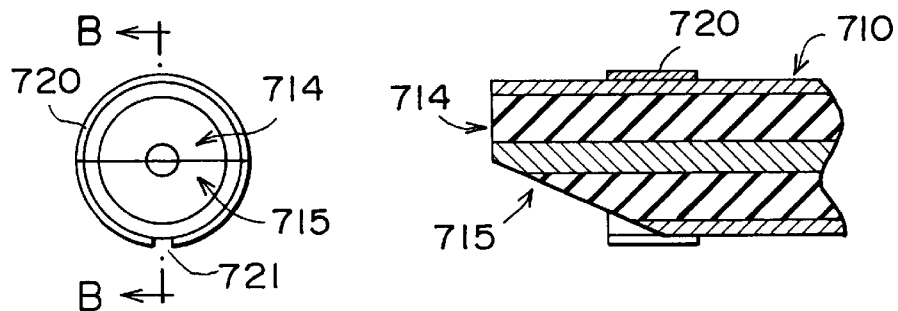
FIG. 19C shown a front view of the tip portion structure in a state after a third step subsequent to the state of FIG. 19B, and a sectional view taken along line B—B in the front view.
Figure 19D:
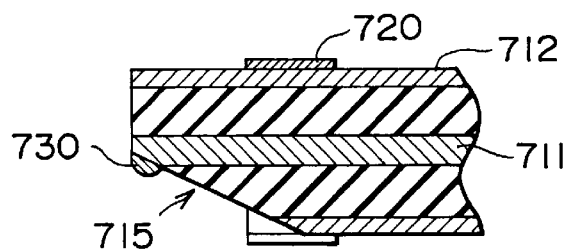
FIG. 19D is a sectional view W along line A—A in the front view of FIG. 19C in a state after a fourth stop subsequent to the state of FIG. 19C.
Figure 21:
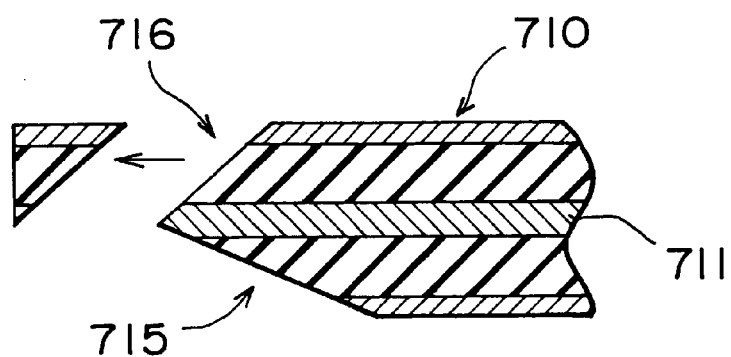
FIG. 21 is a longitudinal sectional view in a state after a step where can be inserted subsequent to the state of FIG. 19B.

With reference to FIG. 21, a description will be next made on a fabricating, which can be inserted subsequent to the state of FIG. 19B.

After forming the first oblique cut surface 715 in the fabricating of FIG. 21, the coaxial cable 710 is cut obliquely with respect to the axial direction in a direction opposed to the first oblique cut surface 715. In an illustrated example the coaxial cable 710 is cut obliquely upwardly along a plane crossing the center of the cross section surface 714 (in FIG. 19B) in the circular form.

Consequently, as illustrated in FIG. 21, the first oblique cut surface 715 and the second oblique cut surface 716 are formed to extend perpendicularly to a plane containing the drawing sheet respectively. And a linear line defined by intersection between both the cut surfaces corresponds to the central line of the cross section surface 714 and is formed perpendicularly to the section along line B—B in FIG. 19C.

Subsequent to the fabricating of FIG. 21, the ring 720 is fitted as illustrated in FIG. 19C and the contact bump 730 is then bonded as illustrated in FIG. 19D.

As a result of inserting the fabricating of FIG. 21, it is realized that the coaxial cable 710 constituting the high-frequency probe is obliquely contacted with the DUT under measurement as illustrated in FIG. 20, Accordingly, a contact point at the fore end of the coaxial inner conductor 711 can be visually observed from a position right above the device stage 810.

Figure 22:
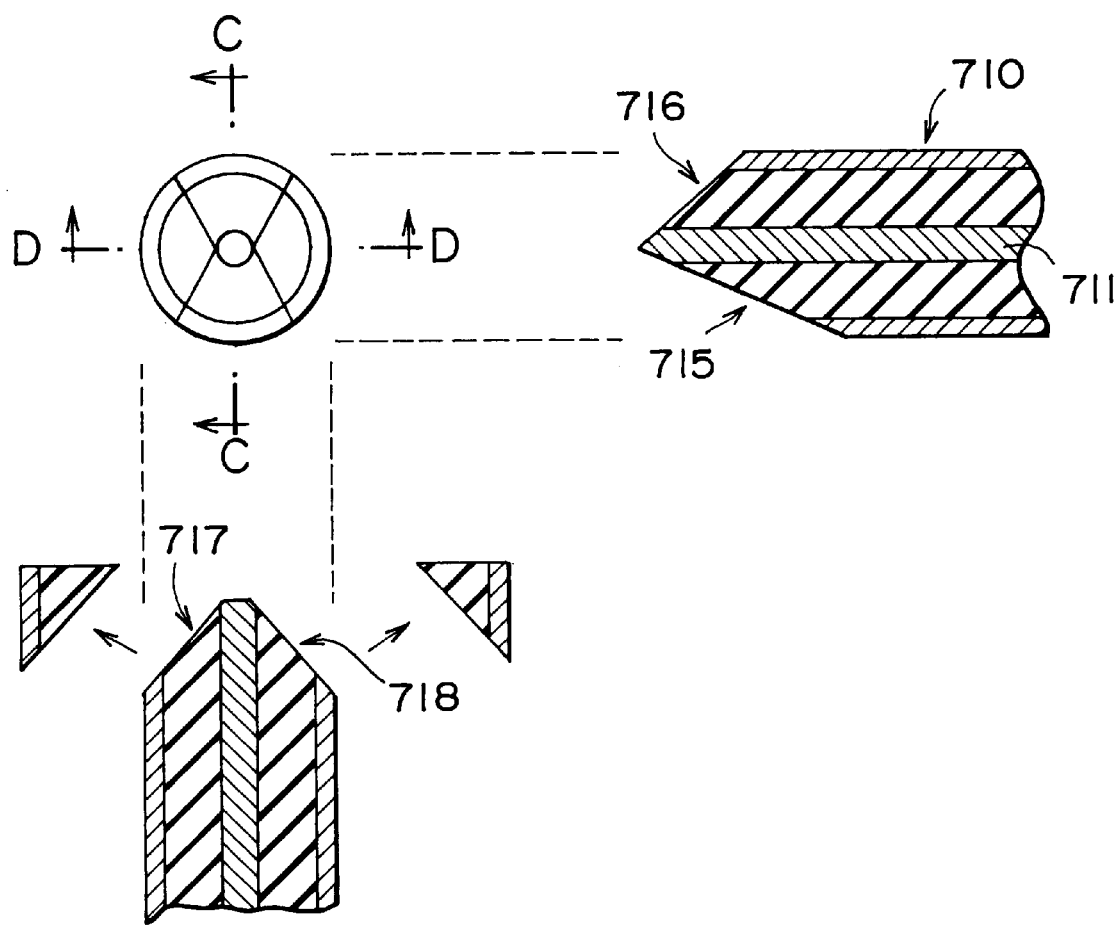
FIG. 22 shows a front view of the tip portion structure in a state after a stop where can be inserted subsequent to the state of FIG. 21, a sectional view taken along line C—C in the front view, and a sectional view taken along line D—D in the front view.

With reference to FIG. 22, a description will be next made on a fabricating, which can be inserted subsequent to the state of FIG. 21. FIG. 22 shows a front view of the cross section surface 714 of the coaxial cable 710 in a state after fabricating to be inserted subsequent to the fabricating described above with reference to FIG. 21. That is, a vertical sectional view taken along line C—C in the front view and looking from the side, and a horizontal sectional view taken along line D—D in the front view and looking from below are illustrated.

After forming the second oblique cut Surface 716 as illustrated in FIG. 21, in the fabricating of FIG. 22, the coaxial cable 710 is cut obliquely to form two third oblique cut surfaces 717 and 718, and formed into a quadrangular pyramid shape. For this purpose, the third oblique cut surfaces 717 and 718 cut the coaxial cable 710 obliquely from the fore end with respect to the axial direction in directions perpendicular to both the first and second oblique cut surfaces 715, 716 and opposed to each other about the axis.

As a result of inserting the fabricating of FIG. 22, in a state that the coaxial cable 710 is obliquely contacted with the DUT under measurement, the surrounding of a contact point at the fore end of the coaxial inner conductor 711 can be visually observed from above and side. This enables the coaxial cable 710 to be positioned easily.

While the fore end of the coaxial cable is formed into a quadrangular pyramid shape, the tip portion of the coaxial cable may be formed into a triangular pyramid shape, a pyramid shape having five or more faces, or a conical shape.

What is claimed is:

1. A tip portion structure of a probe to be pressed against a signal electrode of a DUT (device-under-test) placed on a device stage, the signal electrode of the DUT being located on an upper surface thereof and the DUT having a ground electrode on a lower surface thereof, the device stage having a conductive portion for contacting the ground electrode of the DUT and extending from beneath the DUT, said tip portion structure comprising:

a tip substrate having an upper and a lower surface, the lower surface having a signal line formed thereon;

a conductive ground plate covering the upper surface of the tip substrate;

a plate spring positioned to resist upward pressure on said tip substrate; and a conductive ground block positioned against the lower surface of said tip substrate, a forward surface of the ground block being displaced from a forward end of the tip substrate by an amount such that the conductive ground block may make contact with the conductive portion of the device stage when the signal line of the tip substrate is in electrical contact with the signal electrode of the DUT, the signal line and the conductive ground plate thereby maintaining a spacing during contact with the DUT, the tip portion structure thereby maintaining a characteristic impedance during contact with the DUT.

2. A tip portion structure of a probe according to claim 1, wherein the tip substrate is formed of a film-like sheet, and wherein the plate spring is formed of a resilient material.

3. A tip portion structure of a probe according to claim 1, further comprising a conductive contact bump provided at a forward portion of said signal line for contacting the signal electrode of the DUT.

4. A tip portion structure of a probe according to claim 1, wherein said signal line is formed by a microstrip line on said tip substrate.

5. A tip portion structure of a probe according to claim 1, wherein said conductive ground plate covering the upper surface of the tip substrate is electrically connected to said ground block such that said signal line is surrounded by grounded conductive structure of said conductive ground plate and said ground block.

6. A tip portion structure of a probe according to claim 1, comprising a plurality of signal lines formed on the lower surface of the tip substrate for contacting a plurality of signal electrodes on a DUT.

7. A tip portion structure of a probe according to claim 6, wherein said signal lines are formed by microstrip lines on said tip substrate, wherein said ground block includes partitions located between said signal lines, and wherein said conductive ground plate covering the upper surface of the tip substrate is electrically connected to said ground block such that said signal lines are surrounded by grounded conductive structure of said conductive ground plate and said ground block.

8. The tip portion structure of a probe according to claim 6, wherein the conductive ground block comprises guide grooves for receiving coaxial cables at a rearward portion thereof.

9. A tip portion structure of a probe according to claim 8, wherein said ground plate and said tip substrate are formed in a one-piece structure.

10. A tip portion structure of a probe according to claim 8, wherein the conductive ground block further comprises a V-shaped groove for positioning conductors of said coaxial cables.

11. A tip portion structure of a probe according to claim 8, comprising a plurality of contact bumps corresponding to said guide grooves.

12. A tip portion structure of a probe according to claim 8, wherein said plate spring is detachably fixed to said conductive ground block.

13. A tip portion structure of a probe according to claim 1, wherein said plate spring comprises a bracket bonded to said conductive ground plate and having rearward surface for electrical connection to an outer conductor of a coaxial cable.

14. A tip portion structure of a probe according to claim 13, wherein said signal line has a rearward end for connection to an inner conductor of a coaxial cable.

15. A tip portion structure of a probe according to claim 13, further comprising a conductive contact bump provided at a forward portion of said signal line for contacting the signal electrode of the DUT.

16. A tip portion structure of a probe according to claim 13, further comprising a conductive ring for receiving a coaxial cable at a rearward portion of the tip structure and electrically connecting to an outer conductor of the coaxial cable.

17. A tip portion structure of a probe according to claim 16, wherein said ring has a slit formed at a lower portion thereof.

18. A tip portion structure of a probe to be pressed against a signal electrode of a DUT (device-under-test) placed on a device stage, the signal electrode of the DUT being located on an upper surface thereof and the DUT having a ground electrode on a lower surface thereof, the device stage having a conductive portion for contacting the ground electrode of the DUT and extending from beneath the DUT, said tip portion structure comprising:

a coaxial cable having an oblique surface exposing an inner conductor of the coaxial cable and an outer conductor of the coaxial cable, a portion of the exposed outer conductor being displaced from a forward end of the exposed portion of the inner conductor by a predetermined amount, the inner conductor of the coaxial cable having a contact area provided at the forward end thereof for contacting a signal electrode of the device stage, the inner conductor and the outer conductor thereby maintaining a spacing during contact with the DUT, the tip portion structure thereby maintaining a characteristic impedance during contact with the DUT.

19. A tip portion structure of a probe according to claim 18, wherein said oblique surface of said coaxial cable has a structure as formed by cutting said coaxial cable at a plane perpendicular to the axial direction of said coaxial cable to form a cross section surface as an end surface, and then cutting said cross section surface from substantially the center thereof along at least one oblique plane with respect to the axial direction of said coaxial cable.

20. A tip portion structure of a probe according to claim 18, further comprising a conductive ring surrounding the coaxial cable at a rearward portion of the tip structure and electrically connecting to an outer conductor of the coaxial cable.

21. A tip portion structure of a probe according to claim 20, wherein said ring has a slit formed at a lower portion thereof.

22. A tip portion structure of a probe according to claim 18, wherein said inner conductor has a contact bump provided at the forward end thereof.

* * * * *

UNITED STATES PATENT AND TRADEMARK OFFICE
CERTIFICATE OF CORRECTION

PATENT NO. : 6,281,691 B1
DATED : August 28, 2001
INVENTOR(S) : Kouji Matsunaga et al.

It is certified that error appears in the above-identified patent and that said Letters Patent is hereby corrected as shown below:

<u>Title page,</u>
Item [73], Assignee, please correct to read:
-- [73]   Assignees:   NEC Corporation; Anritsu Corporation, both of Tokyo (JP) --

Signed and Sealed this

First Day of February, 2005

JON W. DUDAS
*Director of the United States Patent and Trademark Office*